United States Patent
Chang et al.

(10) Patent No.: US 12,288,597 B2
(45) Date of Patent: Apr. 29, 2025

(54) SETTING MODULE AND SETTING METHOD THEREOF FOR SYNCHRONOUS DYNAMIC RANDOM ACCESS MEMORY

(71) Applicant: REALTEK SEMICONDUCTOR CORPORATION, Hsinchu (TW)

(72) Inventors: Ya-Min Chang, Hsinchu (TW); Ching-Yun Cheng, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 134 days.

(21) Appl. No.: 18/069,226

(22) Filed: Dec. 20, 2022

(65) Prior Publication Data

US 2023/0206972 A1 Jun. 29, 2023

(30) Foreign Application Priority Data

Dec. 27, 2021 (TW) ................. 110148981

(51) Int. Cl.
*G11C 7/20* (2006.01)
*G06F 13/16* (2006.01)
*G11C 11/4063* (2006.01)

(52) U.S. Cl.
CPC ............ *G11C 7/20* (2013.01); *G06F 13/1689* (2013.01); *G11C 11/4063* (2013.01)

(58) Field of Classification Search
CPC ..... G11C 7/20; G11C 11/4063; G11C 7/1045; G11C 7/1072; G11C 11/4072; G06F 13/1689
USPC .......................................... 365/233.14, 233.5
See application file for complete search history.

(56) References Cited

U.S. PATENT DOCUMENTS

| | | | | |
|---|---|---|---|---|
| 5,999,474 A | * | 12/1999 | Leung | .................. G11C 11/406 365/222 |
| 6,047,343 A | * | 4/2000 | Olarig | ................. G06F 13/4081 711/115 |
| 2004/0044870 A1 | * | 3/2004 | Pawlowski | ......... G06F 12/0207 711/169 |
| 2004/0049629 A1 | | 3/2004 | Seiji et al. | |
| 2006/0010313 A1 | | 1/2006 | Chu et al. | |
| 2006/0221759 A1 | * | 10/2006 | Smith | .................... G11C 7/222 365/210.1 |
| 2007/0091705 A1 | * | 4/2007 | Hayashi | ............... G11C 7/1066 365/222 |

(Continued)

FOREIGN PATENT DOCUMENTS

JP 2008071371 A * 3/2008

OTHER PUBLICATIONS

Office action dated Jan. 7, 2023 from the Taiwan corresponding application 110148981.

(Continued)

*Primary Examiner* — Michael T Tran
(74) *Attorney, Agent, or Firm* — WPAT, P.C.; Anthony King

(57) ABSTRACT

The present disclosure provides a circuit and a method thereof for setting an SDRAM. The circuit includes at least one register and a controller circuit. The controller circuit is configured to: control the SDRAM to switch to an initialization setting mode, wherein the initialization setting mode is utilized for initialing the SDRAM; set value of the at least one register under the initialization setting mode; and set the SDRAM according to the value of the at least one register.

19 Claims, 5 Drawing Sheets

(56) References Cited

U.S. PATENT DOCUMENTS

| | | | | |
|---|---|---|---|---|
| 2007/0162734 | A1* | 7/2007 | Noguchi | G06F 9/4401 |
| | | | | 713/1 |
| 2007/0253262 | A1* | 11/2007 | Oh | G11C 7/1027 |
| | | | | 365/193 |
| 2008/0235444 | A1* | 9/2008 | Gower | G11C 5/04 |
| | | | | 711/105 |
| 2008/0284465 | A1* | 11/2008 | Kao | H04L 25/0278 |
| | | | | 326/30 |
| 2009/0183053 | A1* | 7/2009 | Ito | G11C 11/4096 |
| | | | | 714/764 |
| 2010/0037014 | A1* | 2/2010 | Lim | G11C 7/22 |
| | | | | 711/E12.001 |
| 2010/0070690 | A1* | 3/2010 | Amer | G06F 3/0673 |
| | | | | 711/E12.001 |
| 2010/0195412 | A1* | 8/2010 | Furutani | G11C 8/06 |
| | | | | 365/236 |
| 2011/0128766 | A1* | 6/2011 | Parkinson | G11C 7/10 |
| | | | | 365/163 |
| 2011/0225471 | A1* | 9/2011 | Shore | G11C 29/36 |
| | | | | 714/719 |
| 2013/0346684 | A1* | 12/2013 | Bains | G11C 11/4096 |
| | | | | 711/E12.001 |
| 2017/0118502 | A1* | 4/2017 | Tongle | H04N 21/4383 |
| 2018/0019023 | A1* | 1/2018 | Han | G11C 29/006 |
| 2023/0012747 | A1* | 1/2023 | Liu | G11C 11/413 |
| 2023/0120860 | A1* | 4/2023 | Zhou | G06F 9/30058 |
| | | | | 712/234 |

OTHER PUBLICATIONS

English brief translation of the office action dated Jan. 7, 2023 from the Taiwan corresponding application 110148981.
JEDEC, DDR3 SDRAM Standard JESD79-3F, pp. 17 to 34.

* cited by examiner

SETTING MODULE AND SETTING METHOD THEREOF FOR SYNCHRONOUS DYNAMIC RANDOM ACCESS MEMORY

CROSS REFERENCE TO RELATED APPLICATIONS

This application claims priority of Taiwan application No. 110148981 filed on Dec. 27, 2021, which is incorporated by reference in its entirety.

BACKGROUND

Field of the Invention

The present invention relates generally to a technique of circuit and method thereof for memory, in particular, to circuit and method thereof for setting a synchronous dynamic random access memory.

Description of Related Art

In the synchronous dynamic random access memory (SDRAM) architecture, it is necessary to initialize the SDRAM through an SDRAM controller. When manufacturing a conventional SDRAM controller, it is usually developed according to the instructions and operation sequence to be executed. However, if there are any defects, flaws or errors in the initialization settings or the sequence of settings for SDRAM in the completed SDRAM controller, it will be difficult to be verified or corrected by other methods.

BRIEF SUMMARY OF THE INVENTION

Some embodiments of the present invention provide a method including: controlling a synchronous dynamic random access memory (SDRAM) to switch to an initialization setting mode that initialize the SDRAM by performing the following step: setting a value of at least one register under the initialization setting mode; and setting the SDRAM according to the value of the at least one register.

Some embodiments of the present invention provide a circuit for an SDRAM. The circuit includes at least one register and a controller circuit. The at least one register and the controller circuit are electrically coupled to the SDRAM. The controller circuit is configured to: control the SDRAM to switch to an initialization setting mode, wherein the initialization setting mode is configured to initialize the SDRAM; set a value of at least one register under the initialization setting mode; and set the SDRAM according to the value of the at least one register.

BRIEF DESCRIPTION OF THE DRAWINGS

Aspects of the present invention are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Embodiments of the present invention are discussed in detail below. It should be appreciated, however, that the present invention provides many applicable inventive concepts that can be embodied in a wide variety of specific contexts. The specific embodiments discussed are merely illustrative and do not limit the scope of the disclosure.

The conventional synchronous dynamic random access memory (SDRAM) architecture is not flexible for operation. If there are any defects, flaws or errors in the initialization settings or the sequence of settings for SDRAM, it will be difficult to be verified or corrected by other methods. To increase the operational flexibility of the SDRAM architecture, the present disclosure provides a circuit and a setting method thereof.

Figure 1:
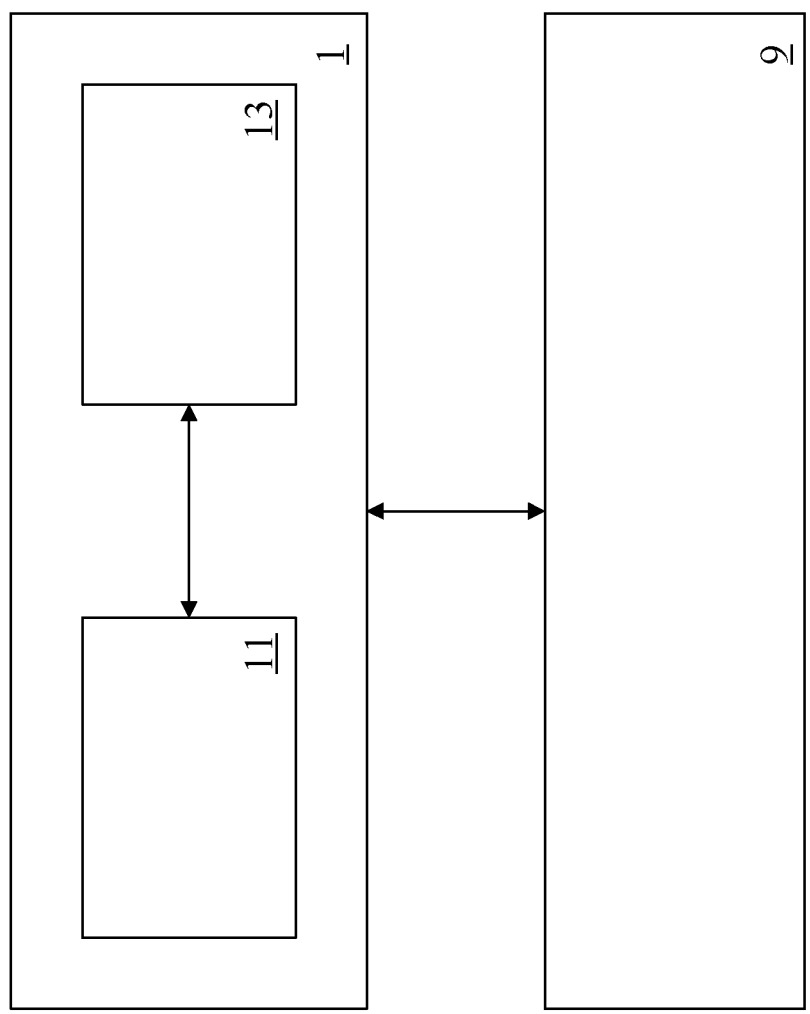
FIG. 1 is a block diagram illustrating a circuit according to some embodiments of the present disclosure.

Reference is made to FIG. 1, which is a block diagram illustrating a circuit 1 according to certain embodiments of the present disclosure. The circuit 1 includes at least one register 11 and a controller circuit 13, wherein the register 11 and the controller circuit 13 are electrically coupled. The circuit 1 and a synchronous dynamic random access memory (SDRAM) 9 are electrically coupled. Data and signals are transmitted between components via an electrical connection. The related control operations will be discussed further below.

In certain embodiments, the SDRAM 9 exchanges data with a device (e.g., a computer host) via a general bus. When it is necessary to perform the initialization setting to the SDRAM 9, the controller circuit 13 switches the SDRAM 9 to an initialization setting mode based on the user's commands. In this case, the initialization setting mode is configured to initialize the SDRAM 9.

Under initialization setting mode, the user can set a value of at least one register 11 using the controller circuit 13. Then, after completing the setting of the value of at least one register 11, the controller circuit 13 sets the SDRAM 9 according to the value of at least one register 11. More specifically, when the user has to perform the initialization setting to the SDRAM 9, the user often needs to perform setting to different command types of the SDRAM 9 so as to complete the initialization setting of the SDRAM 9.

In certain embodiments, the command type of the SDRAM 9 includes: (1) macro command (macro command) type, such as: CMD_TYPE set, Refresh, Pre-charge all banks and No operation; (2) mode address type, such as: mode register address; (3) mode data type, such as: mode register access data; and (4) timing type, such as: the timing interval between two commands.

Different values of at least one register 11 correspond to combinations of different command types of the SDRAM 9; thus, the user is able to fill in a corresponding value in at least one register 11 with respect to different command types. In this way, after completing the setting of the value of at least one register 11, the controller circuit 13 can set the SDRAM 9 according to the value of at least one register 11 to complete the initialization setting of the SDRAM 9.

Figure 2A:
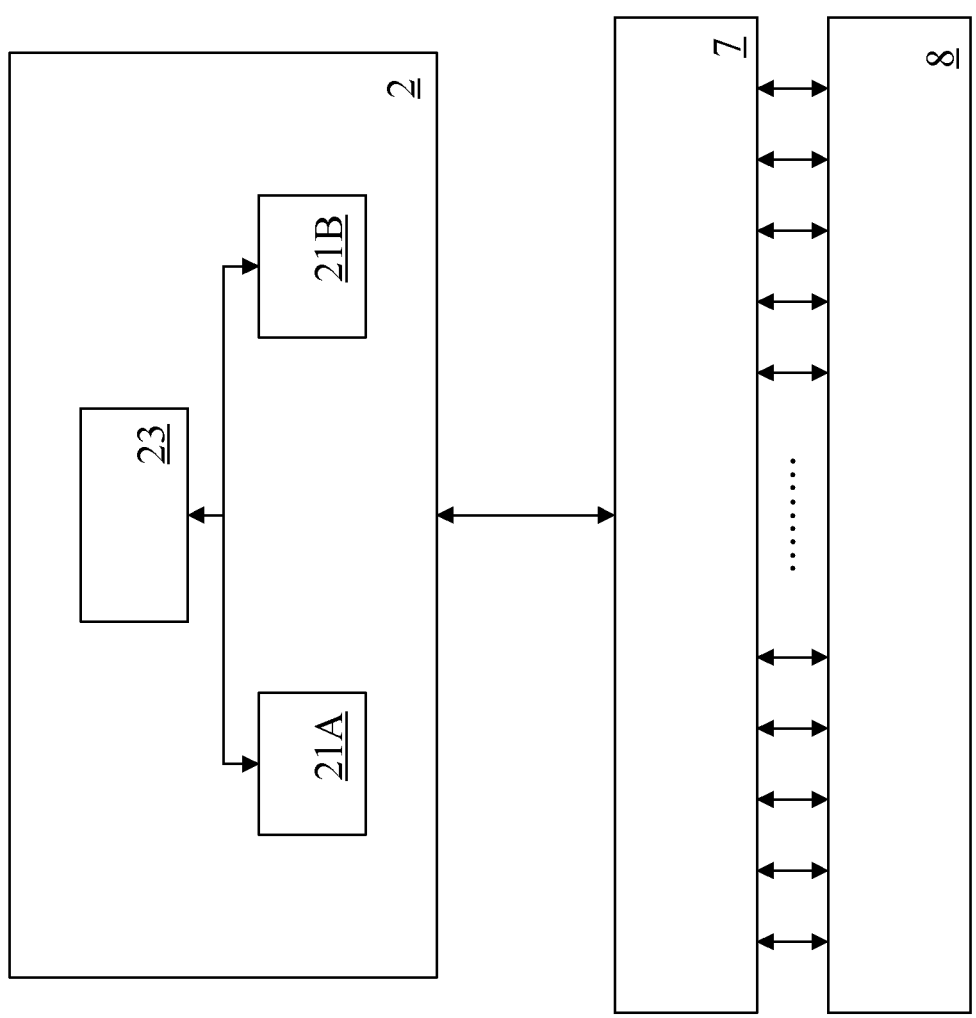
FIG. 2A is a block diagram illustrating a circuit according to some embodiments of the present disclosure.

Reference is made to FIG. 2A, which is a block diagram illustrating a circuit 2 according to certain embodiments of the present disclosure. The circuit 2 includes a plurality of registers 21A and 21B and a controller circuit 23, the registers 21A and 21B, and a controller circuit 23 that are electrically connected. In certain embodiments, the register 21A includes a command index register, which stores numbers corresponding to commands related to the index and timing the SDRAM 8. The register 21B includes a macro command and mode data register, which stores numbers corresponding to a macro command, mode address and mode data of the SDRAM 8.

The circuit 2 is electrically coupled to an SDRAM 8 via a demultiplexer 7. A plurality outputs of the demultiplexer 7 correspond to a plurality of pins of the SDRAM 8. The demultiplexer 7 is configured to decode the number provided by the circuit 2 and trigger the corresponding pin of the SDRAM 8 according to a decoded value, so as to set the SDRAM 8. Data and signals are transmitted between components via an electrical connection. The related control operations will be discussed further below.

In certain embodiments, when the SDRAM 8 is in a bus data access mode (that is, the SDRAM 8 exchanges data with a device (such as, a computer host) via a general bus), and it is necessary to perform the initialization setting to the SDRAM 8, the controller circuit 23 terminates the bus data access mode of the SDRAM 8 according to the user's commands, and switches the SDRAM 8 to an initialization setting mode. In this case, the initialization setting mode is configured to initialize the SDRAM 8. More specifically, under the initialization setting mode, the setting of the initialization is performed based mainly on the command type and the operation sequence required for the operation of the SDRAM 8.

Under the initialization setting mode, the user can use the controller circuit 23 to set the values of the registers 21A and 21B. Next, after completing the setting of the values of the registers 21A and 21B, the controller circuit 23 sets the SDRAM 8 according to the values of the registers 21A and 21B. More specifically, when the user has to perform the initialization setting to the SDRAM 8, the user often needs to perform setting to different command types of the SDRAM 8 so as to complete the initialization setting of the SDRAM 8.

Different values of the registers 21A and 21B correspond to combinations of different command types of the SDRAM 8; thus, the user is able to fill in corresponding values in the registers 21A and 21B with respect to different command types. In this way, after completing the setting of the value of the registers 21A and 21B, the controller circuit 13 can set the SDRAM 8 according to values of the registers 21A and 21B to complete the initialization setting of the SDRAM 8. The technology of the present disclosure is further illustrated by various examples as follows.

In certain examples, the value of the register 21A corresponds to commands related the index and timing of the SDRAM 8. Specifically, the user can use the controller circuit 23 to set a corresponding value in the register 21A, and the number set in the register 21A is configured to correspondingly trigger the initialization setting of commands related to the index and timing of the SDRAM 8. After completing the setting, the controller circuit 23 directly sets the SDRAM 8 according to the value of the register 21A.

In certain examples, the value of the register 21B corresponds to commands related to the macro command of the SDRAM 8. Specifically, the user can use the controller circuit 23 to set a corresponding value in the register 21B, and the number set in the register 21B is configured to correspondingly trigger the initialization setting of the macro command of the SDRAM 8. After completing the setting, the controller circuit 23 directly sets the SDRAM 8 according to the value of the register 21B.

In certain examples, the value of the register 21B corresponds to commands related to the mode address and mode data of the SDRAM 8. Specifically, the user can use the controller circuit 23 to set a corresponding value in the register 21B, and the number set in the register 21B is configured to correspondingly trigger the initialization setting of the mode address and mode data of the SDRAM 8. After completing the setting, the controller circuit 23 directly sets the SDRAM 8 according to the value of the register 21B.

In certain examples, the value of the register 21B corresponds to commands related to a mode register read (MRR) check status of the SDRAM 8. Specifically, the user can use the controller circuit 23 to set a corresponding value in the register 21B, and the number set in the register 21B is configured to correspondingly trigger the initialization setting of the MRR command check status of the SDRAM 8. After completing the setting, the controller circuit 23 directly sets the SDRAM 8 according to the value of the register 21B.

It should be noted that the aforementioned initialization setting operations of the SDRAM 8 can be performed as a single operation or in various combinations depending on the needs. For example, the value of the register 21B can correspond to both the commands related to the macro command and commands related to the mode address and mode data of the SDRAM 8. The user can set the corresponding value in the register 21B using the controller circuit 23, and the value set in the register 21B is used to correspondingly trigger the initialization settings of the commands related to the macro command related instructions and commands related to the mode address and mode data of the SDRAM 8. After completing the setting, the controller circuit 23 directly sets the SDRAM 8 according to the value of the register 21B.

Figure 2B:
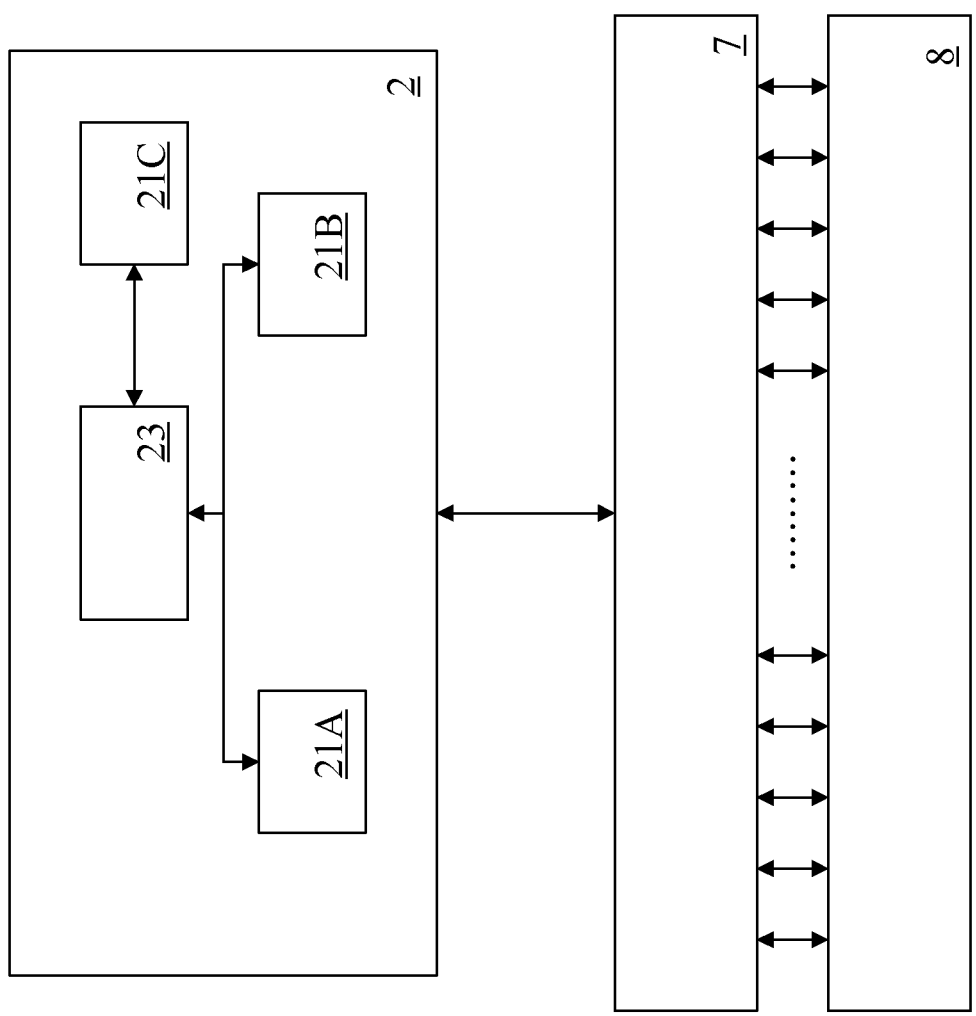
FIG. 2B is a block diagram illustrating a circuit according to some embodiments of the present disclosure.

In certain embodiments, if different initialization settings of the SDRAMs 8 need to be completed simultaneously (such as, the initialization settings of commands related to the index and time, commands related to the macro command, and commands related to the mode address and mode data of the SDRAM 8 need to be completed simultaneously), this can be done by synchronizing the access of the registers 21A and 21B. Specifically, the foregoing initialization settings of the SDRAM 8 can be triggered by an additional synchronization control register. Reference is made to FIG. 2B, which is a block diagram illustrating circuit 2 according to certain embodiments of the present disclosure. The circuit 2 further includes a synchronous control register 21C, configured to (1) mark whether the SDRAM 8 is switched to the initialization setting mode; and (2) synchronously trigger the access of registers 21A and 21B.

Figure 3:
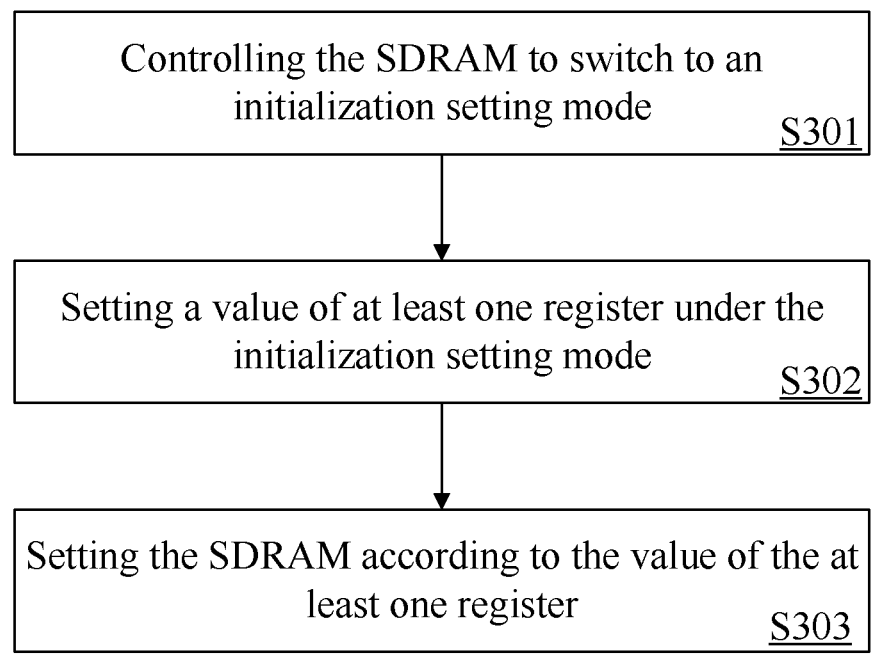
FIG. 3 is a flowchart of a setting method of an SDRAM according to some embodiments of the present disclosure.

Some embodiments of the present disclosure include a setting method of the SDRAM, the flow chart of which is shown in FIG. 3. The setting method of these embodiments is implemented by a circuit (such as the circuit of the previous embodiments), and the details of the method are as follows. Step S301 is executed to control the SDRAM to switch to an initialization setting mode. The initialization setting mode is used to initialize the SDRAM and performed by the following steps. Step S302 is executed to set a value of at least one register under the initialization setting mode. Step S303 is executed to set the SDRAM according to the value of the at least one register.

Figure 4:
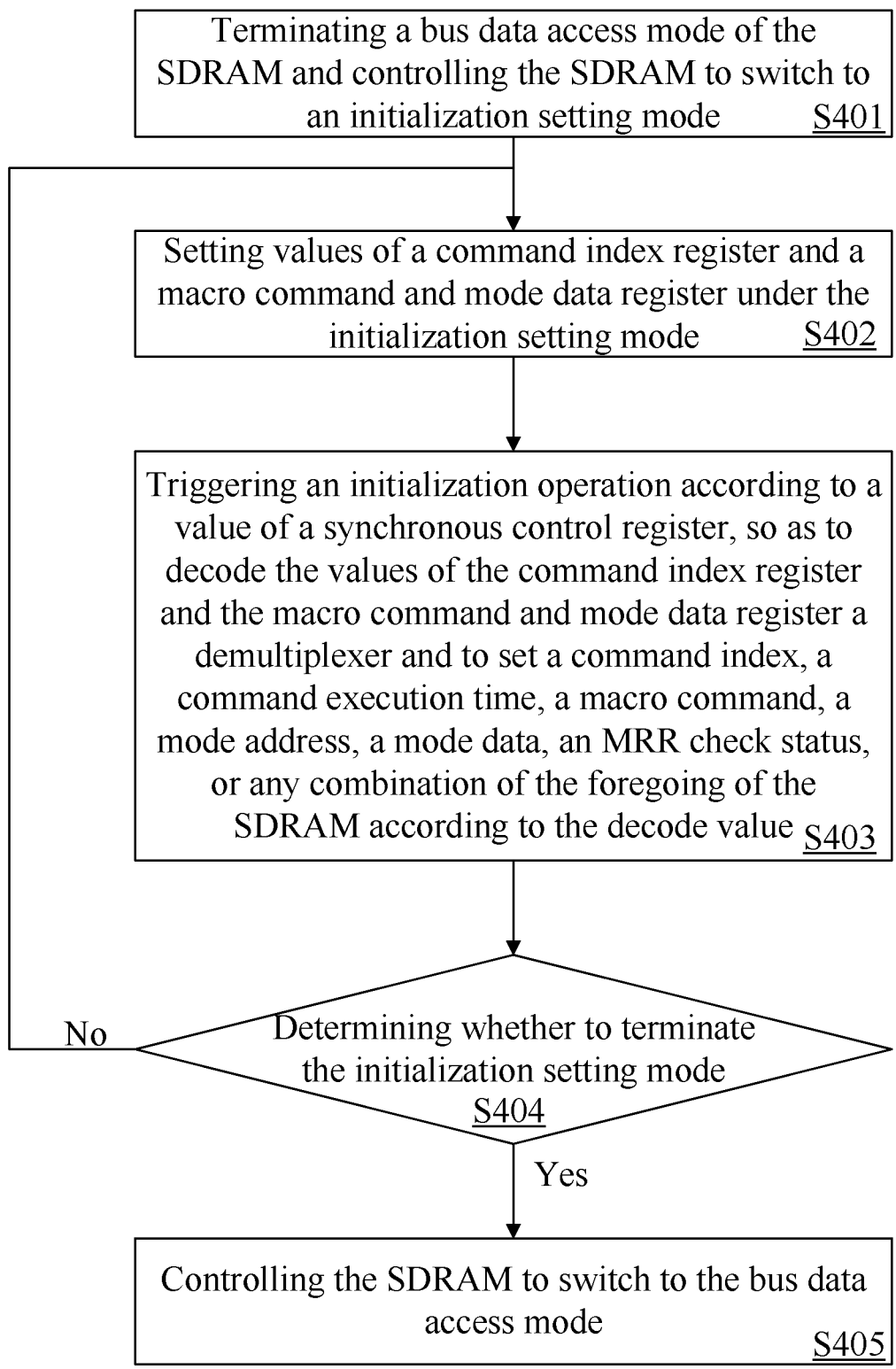
FIG. 4 is a flowchart of a setting method of an SDRAM according to some embodiments of the present disclosure.

Some embodiments of the present disclosure include a setting method of the SDRAM, the flow chart of which is shown in FIG. 4. The setting method of these embodiments is implemented by a circuit (such as the circuit of the previous embodiment), and the details of the method are as follows.

Step S401 is executed to terminate a bus data access mode of the SDRAM, and to control the SDRAM to switch to an initialization setting mode. The initialization setting mode is configured to initialize the SDRAM. Step S402 is executed to set values of a command index register and a macro command and mode data register under the initialization setting mode. Step S403 is executed to trigger an initialization operation according to a value of a synchronous control register, so as to decode the values of the command index register and macro command and mode data register by a demultiplexer and to set a command index, a command execution time, a macro command, a mode address, a mode data, an MRR check status, or any combination of the foregoing of the SDRAM according to the decoded value.

Step S404 is executed to determine whether to terminate the initialization setting mode. If yes, then step S405 is executed to control the SDRAM to switch to the bus data access mode. If not, then step S402 is repeated.

In summary, the present disclosure provides a circuit for the SDRAM and a setting method thereof can control the SDRAM using an additional register and a control circuit to verify or correct defects, flaws or errors in the design and sequence of the initialization operations of the SDRAM. It should be noted that in some embodiments, the controller circuit includes logic circuitry that can perform operations and commands, but it is not intended to limit the implementation of the hardware components of the present disclosure.

While this invention has been described with specific embodiments thereof, it is evident that many alternatives, modifications, and variations may be apparent to those skilled in the art. For example, various components of the embodiments may be interchanged, added, or substituted in the other embodiments. Also, all of the elements of each figure are not necessary for operation of the disclosed embodiments. For example, one of ordinary skill in the art of the disclosed embodiments would be enabled to make and use the teachings of the invention by simply employing the elements of the independent claims. Accordingly, embodiments of the invention as set forth herein are intended to be illustrative, not limiting. Various changes may be made without departing from the spirit and scope of the invention.

What is claimed is:

1. A method, comprising:
controlling a synchronous dynamic random access memory (SDRAM) to switch to an initialization setting mode that initialize the SDRAM by performing the following step:
setting a value of at least one register under the initialization setting mode;
setting the SDRAM according to the value of the at least one register; and
terminating a bus data access mode of the SDRAM, and controlling the SDRAM to switch to the initialization setting mode.

2. The method of claim 1, wherein the step of setting the SDRAM according to the value of the at least one register further comprises:
using a demultiplexer to decode the value of the at least one register, and setting the SDRAM according to a decoded value.

3. The method of claim 1, wherein the at least one register comprises a command index register, and the step of setting the SDRAM according to the value of the at least one register further comprises:
setting a command index and a command execution time of the SDRAM according to a value of the command index register.

4. The method of claim 1, wherein the at least one register comprises a macro command and mode data register, and the step of setting the SDRAM according to the value of the at least one register further comprises:
setting a macro command, a mode address and a mode data of the SDRAM according to a value of the macro command and mode data register.

5. The method of claim 1, wherein the at least one register comprises a macro command and mode data register, and the step of setting the SDRAM according to the value of the at least one register further comprises:
setting a mode register read (MRR) check status of the SDRAM according to a value of the macro command and mode data register.

6. The method of claim 1, wherein the step of setting the SDRAM according to the value of the at least one register further comprises:
triggering an initialization operation, to set the SDRAM according to the value of the at least one register.

7. The method of claim 6, wherein the step of setting the SDRAM according to the value of the at least one register further comprises:
triggering the initialization operation based on a value of a synchronous control register to set the SDRAM according to the value of the at least one register.

8. The method of claim 1, further comprising:
determining whether to terminate the initialization setting mode.

9. The method of claim 8, further comprising:
controlling the SDRAM to switch to a bus data access mode when it is determined that to terminate the initialization setting mode.

10. A circuit for a synchronous dynamic random access memory (SDRAM), comprising:
at least one register electrically coupled to the SDRAM; and
a controller circuit electrically coupled to the SDRAM and the at least one register, and configured to:
control the SDRAM to switch to an initialization setting mode, wherein the initialization setting mode is configured to initialize the SDRAM;
set a value of at least one register under the initialization setting mode;
set the SDRAM according to the value of the at least one register; and
use a demultiplexer to decode the value of the at least one register, and set the SDRAM according to the decoded value.

11. The circuit of claim 10, wherein the at least one register comprises a command index register, and the controller circuit is further configured to:
set a command index and a command execution time of the SDRAM according to a value of the command index register.

12. The circuit of claim 10, wherein the at least one register comprises a macro command and mode data register, and the controller circuit is further configured to:
set a macro command, a mode address and a mode data of the SDRAM according to a value of the macro command and mode data register.

13. The circuit of claim 10, wherein the at least one register comprises a macro command and mode data register, and the controller circuit is further configured to:
   set a mode register read (MRR) check status of the SDRAM according to a value of the macro command and mode data register.

14. The circuit of claim 10, wherein the controller circuit is further configured to:
   terminate a bus data access mode of the SDRAM and control the SDRAM to switch to the initialization setting mode.

15. The circuit of claim 10, wherein the controller circuit is further configured to:
   trigger an initialization operation, to set the SDRAM according to the value of the at least one register.

16. The circuit of claim 15, further comprising a synchronous control register, and the controller circuit is further configured to:
   trigger the initialization operation based on a value of the synchronous control register to set the SDRAM according to the value of the at least one register.

17. The circuit of claim 10, wherein the controller circuit is further configured to:
   determine whether to terminate the initialization setting mode.

18. The circuit of claim 17, wherein the controller circuit is further configured to:
   control the SDRAM to switch to a bus data access mode when it is determined that to terminate the initialization setting mode.

19. A method, comprising:
   controlling a synchronous dynamic random access memory (SDRAM) to switch to an initialization setting mode that initialize the SDRAM by performing the following step:
      setting a value of at least one register under the initialization setting mode; and
      setting the SDRAM according to the value of the at least one register;
   determining whether to terminate the initialization setting mode; and
   controlling the SDRAM to switch to a bus data access mode when it is determined that to terminate the initialization setting mode.

\* \* \* \* \*